(12) United States Patent
Wiegner et al.

(10) Patent No.: US 7,417,498 B2
(45) Date of Patent: Aug. 26, 2008

(54) AMPLIFIER WITH FEEDBACK BRIDGE

(75) Inventors: Dirk Wiegner, Schwaikheim (DE);
Thomas Merk, Fellbach (DE)

(73) Assignee: Alcatel, Paris (FR)

( * ) Notice: Subject to any disclaimer, the term of this patent is extended or adjusted under 35 U.S.C. 154(b) by 155 days.

(21) Appl. No.: 11/452,405

(22) Filed: Jun. 14, 2006

(65) Prior Publication Data
US 2007/0013442 A1  Jan. 18, 2007

(30) Foreign Application Priority Data
Jul. 12, 2005  (EP)  ................................... 05291510

(51) Int. Cl.
*H03F 1/34* (2006.01)

(52) U.S. Cl. ........................................ 330/66; 330/294

(58) Field of Classification Search .................... 330/65, 330/66, 67
See application file for complete search history.

(56) References Cited
U.S. PATENT DOCUMENTS
4,320,349 A * 3/1982 Freers et al. ................. 330/289

4,771,247 A * 9/1988 Jacomb-Hood ............. 330/277
2003/0047800 A1* 3/2003 Sasakura et al. ............ 257/691

FOREIGN PATENT DOCUMENTS
EP 0 309 163 3/1989
EP 1 294 023 3/2003

* cited by examiner

*Primary Examiner*—Steven J Mottola
(74) *Attorney, Agent, or Firm*—Sughrue Mion, PLLC

(57) ABSTRACT

An amplifier, in particular for RF-applications, comprises a circuit board (2), at least one amplifier stage with at least one transistor package (8) arranged on the circuit board (2), and a feedback path (12) around the at least one transistor package (8), said feedback path (12) comprising a feedback element (15) with at least one capacitive (C) element for blocking the flow of direct current through the feedback path (12) and preferably further comprising at least one inductive (L) and/or resistive element (R). In order to reduce negative effects on the performance of the amplifier due to long printed feedback lines, the feedback path (12) in an amplifier according to the invention is formed of a feedback bridge (9) comprising two feedback lines (13, 14) extending out of the plane of the circuit board (2) from two contact flags (10, 11) of the transistor package (8), and the feedback element (15) bridging over the transistor package (8) between the two feedback lines (13, 14).

9 Claims, 2 Drawing Sheets

US 7,417,498 B2

AMPLIFIER WITH FEEDBACK BRIDGE

The invention is based on a priority application EP 05291510.5 which is hereby incorporated by reference.

FIELD OF THE INVENTION

The invention relates to an amplifier, in particular for RF-applications, comprising a circuit board, at least one amplifier stage comprising at least one transistor package arranged on the circuit board, and a feedback path around the at least one transistor package, said feedback path comprising a feedback element with at least one capacitive element for blocking the flow of direct current through the feedback path and preferably further comprising at least one inductive and/or resistive element.

BACKGROUND OF THE INVENTION

In amplifiers, in particular power amplifiers, feedback paths are provided to flatten the gain curve and to assure stability of operation with regard to oscillations. Such feedback paths comprise feedback lines in the form of conductors in connection with feed-back circuit elements, i.e. resistors, inductors, and capacitors, wherein a combination of the latter forms an application-specific feedback element. The use of at least one capacitor in such a feedback path is necessary in order to block the flow of direct current between the input and output of the transistor package, as such a flow would lead to short-circuiting of the transistor package.

Suitable feedback paths for a given application can achieve improvements of bandwidth and gain ripple versus frequency as well as stabilize individual stages of multi-stage amplifiers, e.g. preamplifiers, driver amplifiers and also, especially when lower output levels are required, final amplifiers of modular amplifiers.

Amplifiers of the above-mentioned type use bulky transistors, i.e. being relatively big with regard to the used wavelengths, hereinafter referred to as packaged transistors or transistor packages, which are used as surface mounted devices (SMDs) or drop-in devices in hybrid circuit layouts and which require an extensive amount of circuit board space. There are known transistor packages with fully integrated feedback paths, i.e. the individual feedback loops are integrated in the transistor packages, which can be used to build up the amplifier. Normally, subsequent modification of the feedback elements is not possible when implementing this type of integrated feedback solution.

However, for the majority of applications, only packaged transistors without internal feedback paths are available. If a feedback path is needed for a particular application, this problem can only be avoided by either devising an external realisation for the feedback path or by developing an expensive customer specific transistor.

Due to the large sizes of the transistor packages, known amplifiers use external feedback paths comprising printed feedback lines on the circuit board which are relatively long and thus not well suited for high frequency applications, e.g. RF (radio frequency)-applications in the GHz-range. Long lines in feedback paths have a negative effect on the performance of the amplifier. Therefore, such lines should be avoided. A transmission line is referred to as "long" if it is longer than about $1/10$ of the RF wavelength being used. Long lines cause impedance transformation and may therefore lead to an undesirable misbehaviour of the feedback path, e.g. if an inductive element is used as a feedback element it may be transformed into a capacitive element because of the long line.

OBJECT OF THE INVENTION

It is the object of the present invention to provide an amplifier, in particular for high frequency applications, which can be built from standard transistor packages, thus avoiding the use of cost-intensive custom designed elements while assuring operational flexibility, and which does not suffer from loss of performance due to long external feedback lines.

DESCRIPTION OF THE INVENTION

This object is achieved by an amplifier of the above-mentioned type, wherein the feedback path is formed of a feedback bridge comprising two feedback lines extending out of the plane of the circuit board, and the feedback element bridging over the transistor package between the two feedback lines, and wherein a length of the feedback path essentially corresponds to a minimum path length around the transistor package.

By this means, the invention provides a realisation of an external feedback path, which is both economically advantageous as well as suitable for a variety of applications and which furthermore assures a high degree of flexibility for possible subsequent modifications. Owing to the inventive out-of-plone bridge architecture, excessively long feedback lines around bulky transistor packages are avoided, thus reducing the negative effects provoked by the prior-art solutions. This results in an enhanced performance of the inventive amplifier.

Preferably, the feedback lines extend from two contact flags of the transistor package in order to minimize the total length of the feedback path for a given size of the transistor package thus obtaining a maximum reduction of the aforementioned disadvantageous effect of long feedback lines. While this may not be the general case, for regular box-shaped packages this can be achieved by providing feedback lines that extend in an essentially vertical direction with respect to the circuit board in accordance with a further development of the inventive subject matter.

In a variant of the inventive amplifier, the feedback lines are soldered to contact flags of the transistor package. By this means, an easy and durable fixation of the feedback lines is obtained, which does not require any additional and thus potentially expensive fixing arrangements. Alternatively, the feedback lines can be clamped to the contact flags of the transistor package. This provides an easy opportunity for later modification of the feedback bridge and/or its constituent elements.

In a particularly preferred variant of the inventive amplifier the transistor package comprises a power transistor, i.e. a transistor adapted for relatively high currents and power dissipation, such that the amplifier can be used for controlling and switching high currents in specific applications.

Preferably, the inventive amplifier is a multi-stage amplifier wherein the transistor package constitutes part of a preamplifier stage. In an alternative or additional development of the invention, the amplifier is devised as a multi-stage amplifier, and the transistor package constitutes part of a driver amplifier stage. Especially in case that lower output power levels are required, as e.g. for mobile terminal applications, in an additional or alternative development of the invention, the transistor package constitutes part of a final amplifier stage. In this way various amplification characteristics can be achieved by means of an amplifier according to the invention. In order to be able to further adopt the amplification properties of the inventive amplifier to a given specific application the feedback element preferably comprises an inductance, a capacitance, and a resistance, of which at least the inductance and the capacitance are connected in series. According to an alternative and/or additional embodiment of the inventive amplifier, the feedback element comprises a capacitance and a resistance which are connected in series. According to a further alternative and/or additional embodiment of the inventive amplifier, the feedback element may also comprise an inductance, a capacitance, and a resistance, of which at least the inductance and the resistance are connected in parallel.

In further possible embodiments, the capacitor being used as a direct current (DC) blocker may be connected in series to an inductor and a resistor, in series to a resistor only, in series to an inductor only or in series to an inductor with a capacitor in parallel.

Further advantages and characteristics of the present invention can be gathered from the following description of a preferred embodiment with reference to the enclosed drawings. The features mentioned above as well as below can be used in accordance with the invention either individually or in conjunction. The embodiments mentioned are not to be understood as an exhaustive enumeration but rather as examples with regard to the underlying concept of the present invention.

DETAILED DESCRIPTION OF THE INVENTION

Figure 1:
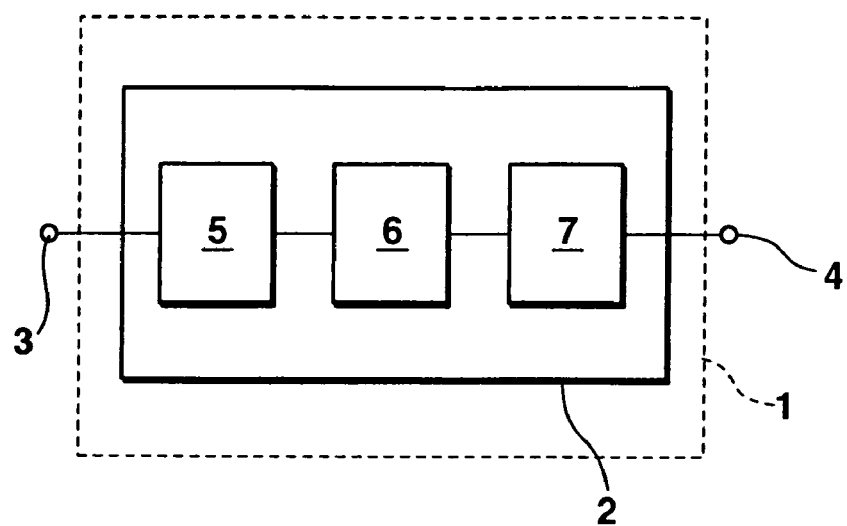
FIG. 1 is a schematic block diagram of a three-stage modular power amplifier.

FIG. 1 shows a highly simplified block diagram of a multi-stage power amplifier 1 for high frequency applications, e.g. transmit amplifiers in base stations or terminals for different frequency bands, in particular L- and S-band, and various communication standards. The amplifier 1 is realised in hybride circuit technology and comprises on a circuit board 2 with printed conductors (cf. FIG. 4) between an input 3 for the signal to be amplified and an output 4 for the amplified signal a succession of three amplifier stages in connection, i.e. a preamplifier stage 5, a driver amplifier stage 6, and a final amplifier stage 7. Amplifiers of this type are commonly known to a person skilled in the art. Therefore all other characteristic features of the amplifier 1 have been left out for simplicity of representation.

In practise, in order to improve the performance of the amplifier 1 in terms of stability or gain characteristics, feedback loops/paths have to be provided around certain transistors in the preamplifier stage 5 and/or the driver amplifier stage 6 in case of lower required output power levels, as e.g. for mobile terminal applications, also the final amplifier stage 7, which comprise bulky (i.e. relatively big with regard to the used wavelengths) standard transistor packages 8 (FIG. 2) without any integrated feedback path. In order to avoid long printed feedback lines around the transistor packages 8, the inventive amplifier 1 comprises at least one external feedback bridge 9 over one of said transistor packages 8, as shown in FIG. 2.

Figure 2:
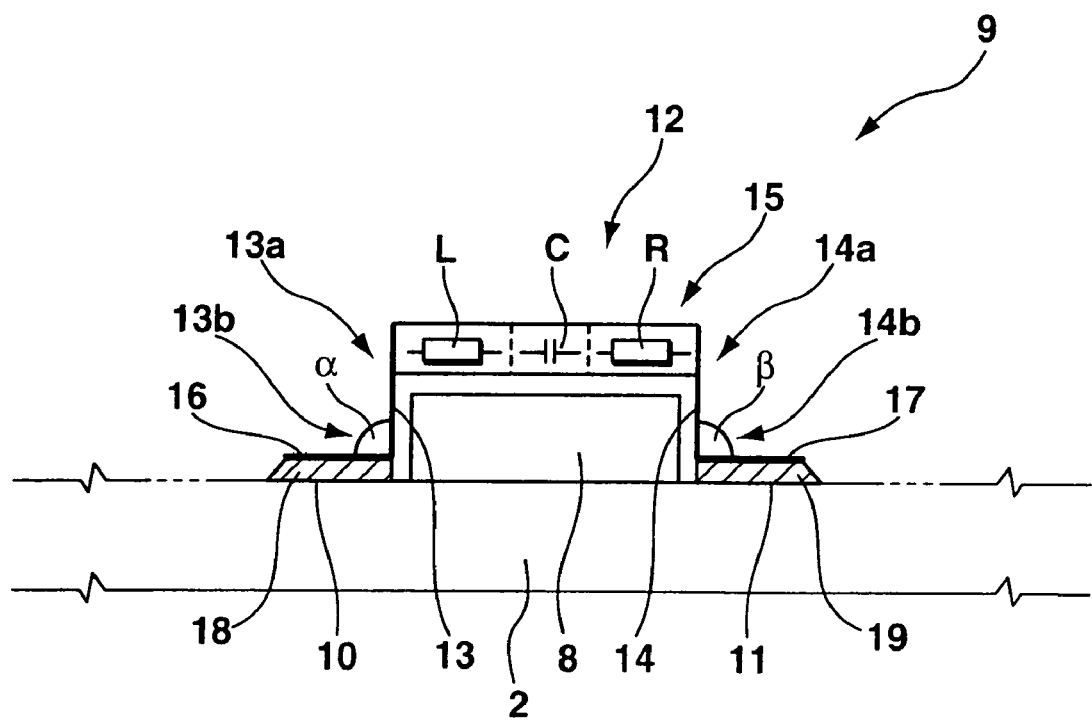
FIG. 2 is a side elevational view of a feedback bridge as used in an amplifier according to the invention.

FIG. 2 shows a transistor package 8 with contact flags 10, 11 arranged on the planar circuit board 2. The transistor package 8 is bridged out of the plane of the circuit board 2 by a feedback path 12 formed by two short feedback lines 13, 14, which extend in a direction essentially normal to the circuit board plane and whose upper ends 13a, 14a are connected by a feedback element 15. The feedback element 15 can comprise any combination of resistive R, inductive L, or capacitive C elements, connected either in series or parallel, as are needed for a specific operation of the amplifier 1 and as depicted schematically in FIG. 2, as long as it is assured that the capacitive C elements are arranged in such a way that the flow of direct current through the feedback path 12 is blocked (e.g. by connecting one capacitor C in series to the other elements). At the lower ends 13b, 14b of the feedback lines 13, 14 the feedback bridge 9 is provided with contact pads 16, 17 which are soldered onto the contact flags 10, 11 of the transistor package 8 by means of a suitable solder layer 18, 19. In the embodiment shown, the angles α, β between the vertical feedback lines 13, 14 and the contact pads 16, 17 are essentially right angles, i.e. $\alpha=\beta\approx90°$ in order to minimize the total length of the feedback path 12 required to bridge the transistor package 8. However, in different embodiments within the scope of the invention α and β can take on any other suitable value. Furthermore, α and β do not necessarily have to be of equal value, e.g. if additional conductive elements (not shown) are to be included in one of the solder layers 18, 19 between one of the contact pads 16, 17 and the corresponding contact flag 10, 11 thus raising the respective contact pad 16, 17.

Figure 3:
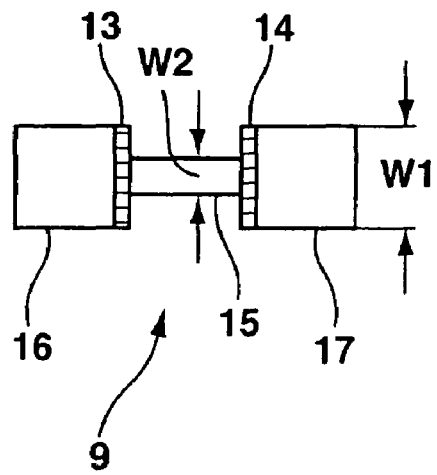
FIG. 3 is a top view of the feedback bridge according to FIG. 2.

FIG. 3 shows a top view of the feedback bridge 9 described above. According to this figure the contact pads 16, 17 as well as the feedback lines 13, 14 have a common width W1 whereas the feedback element 15 can have a smaller width W2. The contact pads 16, 17 and the corresponding feedback lines 13, 14 are preferably designed as integral parts which are bent to form the angles α, β and to which the feedback element 15 is connected by any suitable means known in the art.

Figure 4:
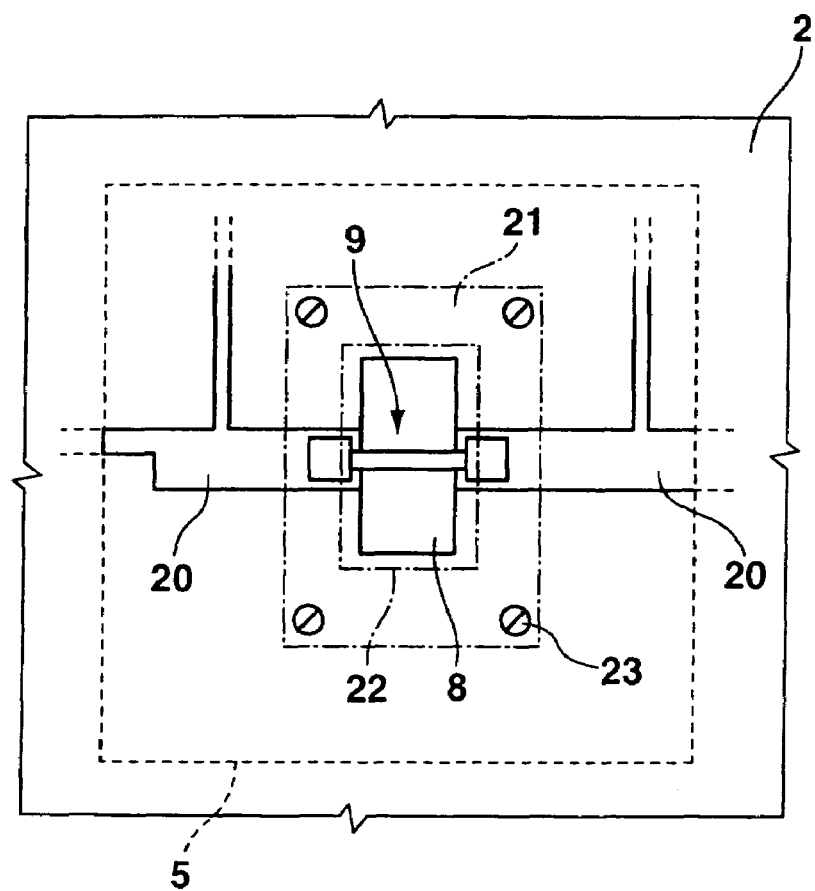
FIG. 4 is a detailed schematic view of a single stage in a multi-stage amplifier according to the invention.

Finally, FIG. 4 shows in more detailed fashion a single amplifier stage, e.g. the preamplifier stage 5, of an amplifier 1 according to the invention. On the circuit board 2 are provided printed conductors 20 for electrically contacting the various building blocks of the amplifier 1, one of which is a power transistor in the form of a transistor package 8. The latter is arranged for electrical contact with its contact flags (not shown) on the corresponding printed conductors 20. Furthermore, the transistor package 8 is bridged by a feedback bridge 9, as has been described in detail with reference to FIGS. 2 and 3. In addition and/or as an alternative to soldering, the feedback bridge can also be fixed to the circuit board 2 by means of a clamp 21, which is depicted with dash-dotted lines in FIG. 4. The clamp 21 is of overall flat rectangular shape and provided with a central opening 22 dimensioned to surround the box-shaped transistor package 8 while covering the contact pads 16, 17 of the feedback bridge 9 in order to hold them firmly against the circuit board 2 and the corresponding conductors 20, respectively. The clamp 21 is fixed on the circuit board 2 by any suitable fixing means, e.g. screws 23 in conjunction with threaded holes in the circuit board (not shown).

The present invention thus provides an amplifier suitable for high frequency applications, which can be built from standard transistor packages, thus avoiding the use of cost intensive custom designed elements while assuring operational and modification flexibility, and which does not suffer from loss of performance due to excessively long external feedback lines.

It is understood that the present invention may also be advantageously used for bridging other elements in RF applications which have such dimensions that a feedback bridge extending out of the plane of the circuit board leads to a shorter feedback path compared to a feedback path on the board. This is especially the case when the distance between the contact flags and the height of the element to be bridged are much smaller than its lateral extension on the board.

The invention claimed is:

1. An amplifier, in particular for RF-applications, comprising:

a circuit board, at least one amplifier stage comprising at least one transistor package arranged on the circuit board, and a feedback path around the at least one transistor package, said feedback path comprising a feedback element with at least one capacitive element for blocking the flow of direct current through the feedback path and preferably further comprising at least one inductive and/or resistive element, wherein the feedback path is formed of a feedback bridge comprising two feedback lines extending out of the plane of the circuit board, and the feedback element bridging over the transistor package between the two feedback lines, and in that a length of the feedback path essentially corresponds to a minimum path length around the transistor package.

2. An amplifier according to claim 1, wherein the feedback lines extend from two contact flags of the transistor package.

3. An amplifier according to claim 1, wherein the feedback lines extend in essentially vertical direction with respect to the circuit board.

4. An amplifier according to claim 1, wherein the feedback lines are soldered to contact flags of the transistor package.

5. An amplifier according to claim 1, wherein the feedback lines are clamped to contact flags of the transistor package.

6. An amplifier according to claim 1, wherein the transistor package comprises a power transistor.

7. An amplifier according to claim 1, wherein it is a multi-stage amplifier and that the transistor package constitutes part of a preamplifier stage, a driver amplifier stage and/or a final amplifier stage.

8. An amplifier according to claim 1, wherein the feedback element comprises an inductance, a capacitance, and a resistance, of which at least the inductance and the capacitance are connected in series.

9. An amplifier according to claim 1, wherein the feedback element comprises a capacitance and a resistance which are connected in series.

* * * * *